(12) United States Patent
Xiang et al.

(10) Patent No.: US 6,657,267 B1
(45) Date of Patent: Dec. 2, 2003

(54) SEMICONDUCTOR DEVICE AND FABRICATION TECHNIQUE USING A HIGH-K LINER FOR SPACER ETCH STOP

(75) Inventors: Qi Xiang, San Jose, CA (US); Olov Karlsson, San Jose, CA (US); HaiHong Wang, Fremont, CA (US); Bin Yu, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/163,930

(22) Filed: Jun. 6, 2002

(51) Int. Cl.⁷ ............................................. H01L 29/76
(52) U.S. Cl. .................. 257/410; 257/213; 257/288; 257/411; 438/216; 438/287; 438/301
(58) Field of Search ................... 257/213, 288, 257/310, 410, 411; 438/216, 287, 230, 231, 288, 303, 301, 591, 595, 775, 785

(56) References Cited

U.S. PATENT DOCUMENTS

| | | | |
|---|---|---|---|
| 4,559,091 A | 12/1985 | Allen et al. | |
| 6,013,553 A | 1/2000 | Wallace et al. | |
| 6,020,024 A | 2/2000 | Maiti et al. | |
| 6,107,130 A | 8/2000 | Fulford, Jr. et al. | |
| 6,171,910 B1 * | 1/2001 | Hobbs et al. | 438/275 |
| 6,207,485 B1 | 3/2001 | Gardner et al. | |
| 6,277,738 B1 | 8/2001 | Choi et al. | |
| 6,287,925 B1 * | 9/2001 | Yu | 438/301 |
| 6,297,115 B1 * | 10/2001 | Yu | 438/305 |
| 6,300,201 B1 * | 10/2001 | Shao et al. | 438/281 |
| 6,300,203 B1 * | 10/2001 | Buynoski et al. | 438/287 |
| 6,303,452 B1 | 10/2001 | Chen et al. | |
| 6,380,043 B1 * | 4/2002 | Yu | 438/305 |
| 6,486,080 B2 * | 11/2002 | Chooi et al. | 438/785 |
| 6,504,214 B1 * | 1/2003 | Yu et al. | 257/347 |
| 6,514,808 B1 * | 2/2003 | Samavedam et al. | 438/197 |
| 6,518,070 B1 * | 2/2003 | Alluri et al. | 438/3 |
| 6,518,133 B1 * | 2/2003 | See et al. | 438/300 |
| 6,524,920 B1 * | 2/2003 | Yu | 438/303 |
| 6,531,347 B1 * | 3/2003 | Huster et al. | 438/164 |
| 6,531,365 B2 * | 3/2003 | Dokumaci et al. | 438/296 |
| 6,548,361 B1 * | 4/2003 | En et al. | 438/301 |
| 2003/0042515 A1 * | 3/2003 | Xiang et al. | 257/288 |
| 2003/0071290 A1 * | 4/2003 | Yu et al. | 257/288 |

* cited by examiner

*Primary Examiner*—David Nelms
*Assistant Examiner*—Andy Huynh
(74) *Attorney, Agent, or Firm*—Renner, Otto, Boisselle & Sklar, LLP

(57) ABSTRACT

A semiconductor device and method of fabrication are disclosed. The semiconductor device includes a liner composed of a high-K material. The liner has a portion separating a sidewall spacer from a gate and a portion separating the sidewall spacer from a layer of semiconductor material. The liner functions as an etch stop during formation of the sidewall spacer. The liner is removable by an etch process that has substantially no reaction with an isolation region formed in the layer of semiconductor material.

12 Claims, 2 Drawing Sheets

SEMICONDUCTOR DEVICE AND FABRICATION TECHNIQUE USING A HIGH-K LINER FOR SPACER ETCH STOP

TECHNICAL FIELD

The present invention relates generally to the semiconductor devices and the fabrication thereof and, more particularly, to a semiconductor device fabricated with the use of a high-K liner.

BACKGROUND

Fabrication of semiconductor devices, such as metal oxide semiconductor field effect transistors (MOSFET) and complementary metal oxide semiconductor (CMOS) integrated circuits, involves numerous processing steps. Each step may potentially have an adverse effect on one or more device components.

In a typical MOSFET, a source and a drain are formed in an active region of a semiconductor layer by implanting N-type or P-type impurities in a layer of semiconductor material. Disposed between the source and drain is a body region. Disposed above the body region is a gate electrode. The gate electrode and the body are spaced apart by a gate dielectric layer. It is noted that MOSFETs can be formed in bulk format (for example, the active region being formed in a silicon substrate) or in a semiconductor-on-insulator (SOI) format (for example, in a silicon film that is disposed on a insulating layer that is, in turn, disposed on a silicon substrate).

A pervasive trend in modern integrated circuit manufacture is to produce transistors, and the structural features thereof, that are as small as possible. Although the fabrication of smaller transistors allows more transistors to be placed on a single monolithic substrate for the formation of relatively large circuit systems in a relatively small die area, slight imperfections in the formation of the component parts of a transistor can lead to poor transistor performance and failure of the overall circuit. As an example, during the fabrication process, certain unwanted portions of various device layers are removed using wet chemical etching and/or dry etching (e.g., reactive ion etching (RIE)) techniques. During the etching process desired portions of other layers may become damaged. Such damage can lead to a reduction in the operational performance of the device being fabricated.

Accordingly, there exists a need in the art for semiconductor devices, such as MOSFETs, that are formed using techniques intended to minimize imperfections in the resulting device.

SUMMARY OF THE INVENTION

According to one aspect of the invention, the invention is directed to a semiconductor device. The semiconductor device includes a layer of semiconductor material having an active region defined by at least one isolation region. A gate is disposed on the layer of semiconductor material, the gate including a gate dielectric and a gate electrode, the gate electrode spaced from the layer of semiconductor material by the gate dielectric and the gate defining sidewalls. A sidewall spacer is disposed adjacent each sidewall of the gate and each sidewall spacer extending laterally from the gate over the layer of semiconductor material. The semiconductor device also includes a liner composed of a high-K material, the liner having portions separating the sidewall spacers and the gate and the liner having portions separating the sidewall spacers and the layer of semiconductor material, the liner functioning as an etch stop during formation of the sidewall spacers and the liner being removable by an etch process that has substantially no reaction with the at least one isolation regions.

According to another aspect of the invention, the invention is directed to a method of fabricating a semiconductor device. The method includes the steps of providing a layer of semiconductor material; forming at least one isolation region in the layer of semiconductor material; forming a gate including a gate dielectric and a gate electrode over the layer of semiconductor material, the gate electrode spaced from the layer of semiconductor material by the gate dielectric and the gate defining sidewalls; forming a liner composed of a high-K material adjacent the sidewalls of the gate and extending laterally from the gate over the layer of semiconductor material; depositing a layer of sidewall spacer material over the liner; anisotropically etching the layer of sidewall spacer material to form a sidewall spacer adjacent each sidewall of the gate and using the liner as an etch stop for controlling etching of the layer of sidewall spacer material; implanting dopant species to form deep doped regions of a source and a drain in the layer of semiconductor material; and removing at least a portion of the liner to open the source and the drain for formation of a source contact and a drain contact, the portion of the liner removed using an etch process that has substantially no reaction with the isolation regions.

BRIEF DESCRIPTION OF DRAWINGS

These and further features of the present invention will be apparent with reference to the following description and drawings, wherein.

DISCLOSURE OF INVENTION

Figure 1:
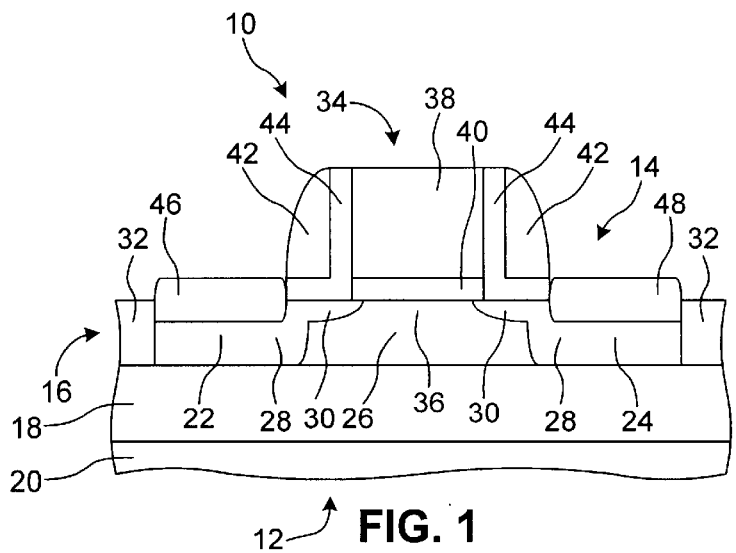
FIG. 1 is a schematic block diagram of an exemplary semiconductor device formed in accordance with the present invention.

In the detailed description that follows, corresponding components have been given the same reference numerals, regardless of whether they are shown in different embodiments of the present invention. To illustrate the present invention in a clear and concise manner, the drawings may not necessarily be to scale and certain features may be shown in somewhat schematic form.

With reference to FIG. 1, a semiconductor device 10 fabricated on a wafer 12 according to an example embodiment of the present invention is illustrated. The illustrated semiconductor device 10 is a metal oxide semiconductor field effect transistor (MOSFET) used, for example, in the construction of a complimentary metal oxide semiconductor (CMOS) integrated circuit. As one skilled in the art will appreciate, the illustrated MOSFET is merely exemplary and the structures and the techniques for fabricating the semiconductor device described herein can be used for other types of semiconductor devices (e.g., other types of transistors, memory cells, etc.). Although only one semiconductor device 10 is illustrated, one skilled in the art will appreciate that multiple semiconductor devices, of any type (including N-channel devices and P-channel devices), can be formed on the wafer 12.

The semiconductor device 10 has an active region 14 formed in a layer of semiconductor material 16. The layer of semiconductor material 16 can be, for example, a silicon substrate for the formation of bulk type devices. Alternatively, and as shown in the illustrated embodiment, the layer of semiconductor material 16 can be a semiconductor file (e.g., a silicon film or a silicon-germanium film) formed on a layer of insulating material 18 (for example, a buried oxide (BOX) layer). The insulating layer 18 is, in turn, formed on a semiconductor substrate 20 so that resultant semiconductor devices are formed on the wafer 12 are formed in semiconductor-on-insulator (SOI) format.

The active region 14 includes a source 22, a drain 24 and a body 26 disposed between the source 22 and the drain 24. The source 22 and the drain 24 respectively include deep doped regions 28 and extensions 30 as will be discussed in greater detail below. The body 26 can be doped with an appropriate dopant (e.g., N-type or P-type doping) or left undoped. The size and placement of the active region 14 is defined by isolation regions 32. The isolation regions 32 can be shallow trench isolation regions (STI) and can be made from an insulating material such as silicon oxide.

A gate 34 is disposed over the body 26 and defines a channel 36 within the body 26 (the channel 36 being interposed between the source 22 and the drain 24 and controlled by a work function of the gate 34). The gate 34 includes a gate electrode 38 spaced apart from the layer of semiconductor material 16 by a gate dielectric 40.

Disposed adjacent each sidewall of the gate 34 is a sidewall spacer 42. The sidewall spacers 42 can be made from a material such as a nitride, an oxide or undoped polysilicon. The spacers 42 act to offset deep doped regions 28 of the source 22 and the drain 24 from the gate 34. The extensions 30 assist in controlling short channel effects (SCE). SCE generally occur when the gate does not have adequate control over the channel region, and can include threshold voltage ($V_t$) roll-off, off current (Ioff) roll-up and drain induced barrier lowering (DIBL). As the physical dimensions decrease, SCE can become more severe. SCE is the result of intrinsic properties of the crystalline materials used in the FET devices. Namely, the band gap and built-in potential at the source/body and drain/body junctions are non-scalable with the reduction of physical device dimensions, such as a reduction in channel length.

As illustrated, the sidewall spacers 42 are separated from the gate 34 and are separated from the layer of semiconductor material 16 by a liner 44. The material of the liner 44 is selected to have high etch selectivity over the material of the sidewall spacers 42 and over the material of the isolation regions 32. In one embodiment of the invention, the liner 44 is made from a high-K material. As used herein, a "high-K material" or a "high-K dielectric material" refers to a material, or stack of materials, having a relative permittivity in one embodiment of about ten (10) or more, and in another embodiment of about twenty (20) or more. Relative permittivity is the ratio of the absolute permittivity ($\epsilon$) found by measuring capacitance of the material to the permittivity of free space ($\epsilon_o$), that is $K=\epsilon/\epsilon_o$. High-K materials will be described in greater detail below. Although other materials can be selected for the liner 44, hafnium silicate, hafnium oxide and aluminum oxide are example suitable materials for the liner 44. In addition, all binary and ternary metal oxides and ferroelectric materials having a K higher than, in one embodiment, about twenty (20) can be used for the gate dielectric 40.

During formation of the sidewall spacers 42 (described in greater detail below), the liner 44 acts as an etch stop during dry etching, or anisotropic reactive ion etching (RIE), of the sidewall spacer 42 material. Without intending to be bound by theory, providing an etch stop for spacer 42 etching with high etch selectivity over the spacer 42 material can minimize undesired damage to the layer of semiconductor material 16. In addition, when removing undesired portions of the liner 44 to open the source and the drain to form a source contact 46 and a drain contact 48, damage to the isolation regions 32 can be minimized. The liner 44 can also be used to offset halo implantations from the gate 34.

It is noted that a high-K material can also be used for the gate dielectric 40. When a high-K material is selected as the gate dielectric 40, the high-K material can have an equivalent oxide thickness (EOT) of about one nanometer (1 nm) or less. In the semiconductor device 10 described herein, a gate dielectric made from a high-K material may be desirable to minimize performance degrading effects, such as leakage, that may occur when the thickness of a standard-K dielectric material becomes thin (e.g., approaching about 1 nm). A high-K dielectric allows for the establishment of a suitable capacitance with a physically thicker dielectric layer. For example, a nitride gate dielectric having a K of about 7.8 and a thickness of about 10 nm is substantially electrically equivalent to an oxide gate dielectric having a K of about 3.9 and a thickness of about 5 nm. In addition, devices fabricated with a high-K dielectric layer tend to have improved reliability. Although other materials can be selected for the gate dielectric 40, hafnium oxide (e.g., $HfO_2$), zirconium oxide (e.g., $ZrO_2$), cerium oxide ($CeO_2$), aluminum oxide (e.g., $Al_2O_3$), titanium oxide ($TiO_2$), yttrium oxide ($Y_2O_3$), barium strontium titanate (BST) are example suitable materials for the gate dielectric 40.

When a high-K material is selected as the gate dielectric 40, a buffer interface (not shown) can be used between the layer of semiconductor material 16 and the gate dielectric 40. The buffer interface can be, for example, an oxide layer(e.g., silicon oxide) having a thickness of about 0.5 nm to about 0.7 nm. The buffer interface acts to reduce diffusion and/or penetration of atoms from the high-K dielectric material into the layer of semiconductor material 16 that could lead to a degradation in channel mobility. In addition, the buffer interface may act to retard reaction of the high-K material with the layer of semiconductor material 16.

In an alternative embodiment, the gate dielectric 40 can be made from a standard-K material. As used herein, the term "standard-K material" or "standard-K dielectric material" refers to a dielectric material having a relative permittivity, or K, of up to about ten (10). Example standard-K materials include, for example, silicon dioxide (K of about 3.9), silicon oxynitride (K of about 4 to 8 depending on the relative content of oxygen and nitrogen) and silicon nitride (K of about 6 to 9).

Figure 2:
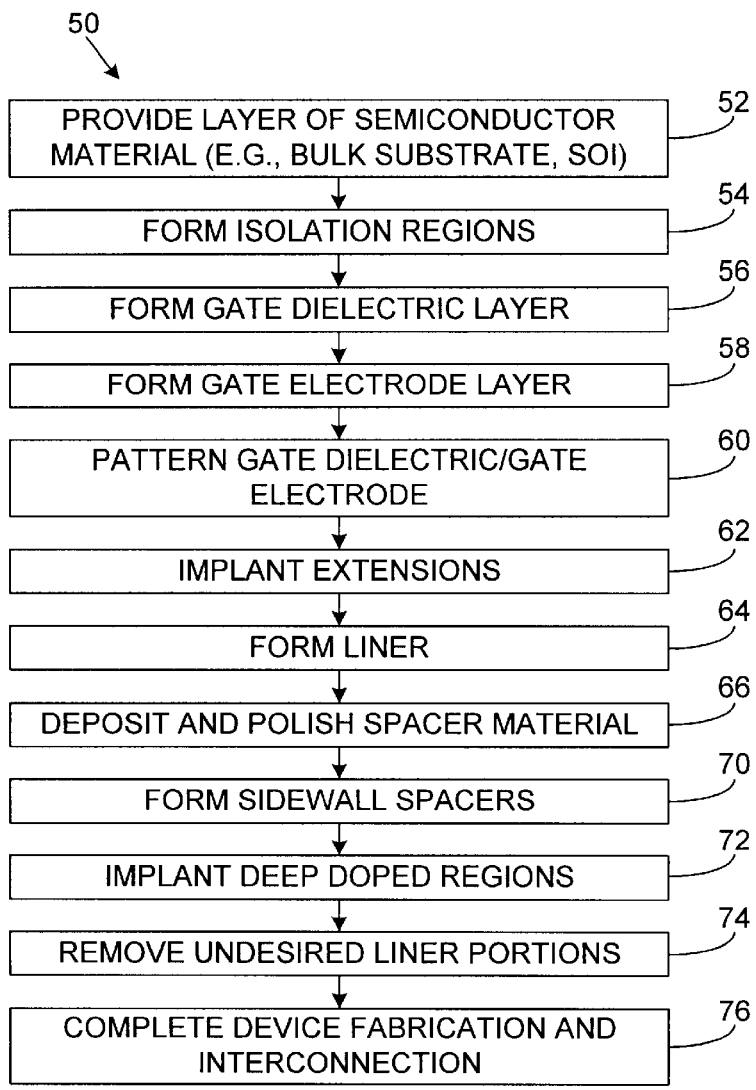
FIG. 2 is a flow chart illustrating a method of forming the semiconductor device of FIG. 1.
Figure 3A:
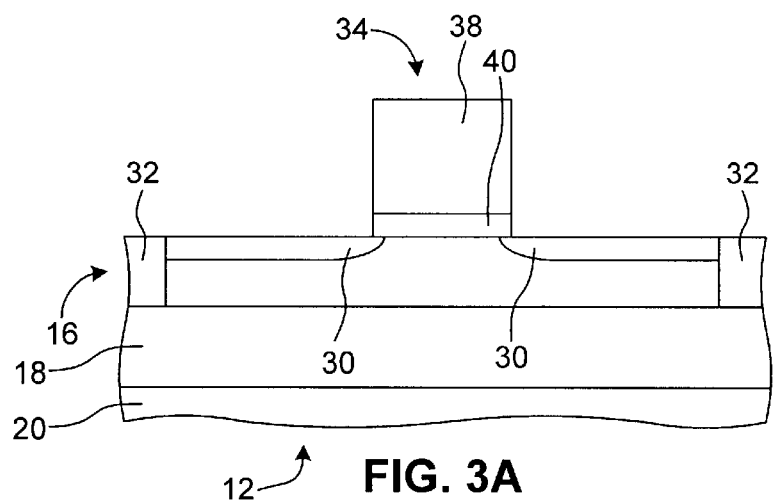
FIGS. 3A through 3C illustrate the semiconductor device of FIG. 1 in various stages of manufacture.

Referring now to FIG. 2, a method 50 of forming the semiconductor device 10 is illustrated. With additional reference to FIG. 3A, the method 50 starts in step 52 where the layer of semiconductor material 16 is provided. As indicated above, the layer of semiconductor material can be a semiconductor substrate (such as a silicon substrate) for the formation of bulk type devices. Alternatively, and as illustrated, the layer of semiconductor material 16 can be a semiconductor film (such as a silicon film) formed as part of an SOI substrate stack.

In step 54, the isolation regions 32 (for example, STI regions) can be formed in the layer of semiconductor material 16 to define the size and placement of multiple active regions 14 (FIG. 1) within the layer of semiconductor material 16. As indicated, the isolation regions 32 can be formed from a material such as silicon oxide (e.g., $SiO_2$).

Next, in step 56, a layer of material used to form the gate dielectric 40 is formed on the layer of semiconductor material 16. The gate dielectric 40 material is formed by growing or depositing a layer of gate dielectric material on top of the layer of semiconductor material 16. It is noted that the layer of material for the gate dielectric 40 will usually extend over at least the entire active region 14.

Next, in step 58, a layer of material used to form the gate electrode 38 is grown or deposited on the layer of material used to form the gate dielectric 40. The gate electrode material can be composed of a metal (e.g., tungsten, tantalum, aluminum, nickel, ruthenium, rhodium, palladium, platinum, titanium, molybdenum, etc.) or a metal containing compound (e.g., titanium nitride, tantalum nitride, ruthenium oxide, etc.). If desired, a doped semiconductor (e.g., polycrystalline silicon, polycrystalline silicon-germanium, etc.) could also be used. The gate electrode material can be selected or doped for N-channel devices (e.g., tungsten, tantalum, aluminum, titanium nitride, tantalum nitride, or N+polysilicon) or for P-channel devices (e.g., tungsten, nickel, ruthenium, rhodium, palladium, platinum, titanium nitride, tantalum nitride, ruthenium oxide or P+polysilicon).

After the layer of material used to form the gate dielectric 40 is grown or deposited in step 56 and the layer of material used to form the gate electrode 38 is grown or deposited in step 58, the gate 34 is patterned in step 60. Techniques for patterning the gate 34 will be known to those skilled in the art and will not be described in detail herein. It is noted, however, that the layer of material used to form the gate dielectric 40 can be patterned separately from patterning of the layer of material used to form the gate electrode 38. In addition, the layer of material used to form the gate dielectric 40 may be left unpatterned or may be patterned after implantation of ion species to dope the source 22 and the drain 24 as discussed below in more detail.

Next, in step 62, the extensions 30 are implanted. The formation of shallow source 22 and drain 24 extensions, such as by using a lightly doped drain (LDD) technique, is well known in the art and will not be described in detail herein. Briefly, for a P-type extension region, ions such as boron, gallium or indium can be implanted. For an N-type extension region, ions such as antimony, phosphorous or arsenic can be implanted. The energy and dosage of the ion species can be determined empirically for the device being fabricated. The extensions 30 may diffuse slightly under the gate 34 as is conventional.

Figure 3B:
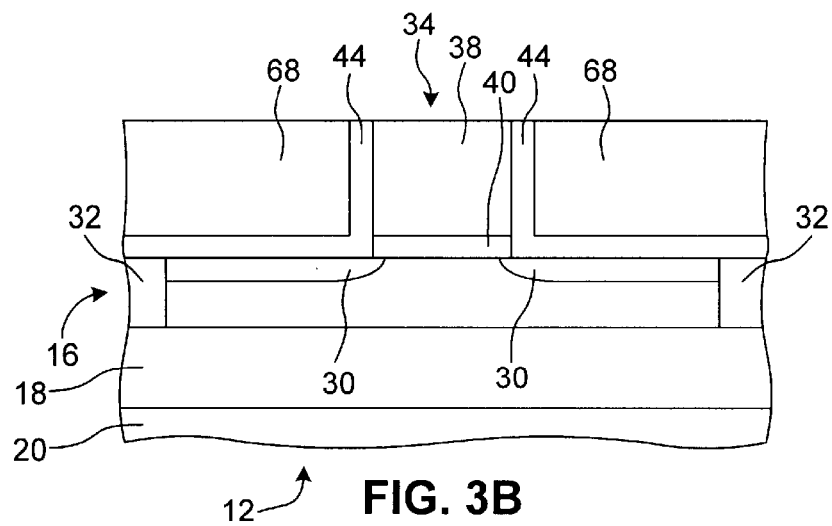

With additional reference to FIG. 3B, the method 50 continues in step 64 by forming the liner 44. The liner 44 can be formed as a conformal layer over the gate 34, adjacent sidewalls of the gate 34 and extending laterally from the gate 34 over the layer of semiconductor material 16. As indicated, the liner 44 is formed from a high-K material. Exemplary high-K materials are identified below in Table 1. It is noted that Table 1 is not an exhaustive list of high-K materials and other high-K materials may be available.

TABLE 1

| Dielectric Material | Approximate Relative Permittivity (K) |
|---|---|
| aluminum oxide ($Al_2O_3$) | 9–10 |
| zirconium silicate | 12 |
| hafnium silicate | 15 |

TABLE 1-continued

| Dielectric Material | Approximate Relative Permittivity (K) |
|---|---|
| hafnium silicon oxynitride | 16 |
| hafnium silicon nitride | 18 |
| lanthanum oxide ($La_2O_3$) | 20–30 |
| hafnium oxide ($HfO_2$) | 40 |
| zirconium oxide ($ZrO_2$) | 25 |
| cerium oxide ($CeO_2$) | 26 |
| bismuth silicon oxide ($Bi_4Si_2O_{12}$) | 35–75 |
| titanium dioxide ($TiO_2$) | 30 |
| tantalum oxide ($Ta_2O_5$) | 26 |
| tungsten oxide ($WO_3$) | 42 |
| yttrium oxide ($Y_2O_3$) | 20 |
| lanthanum aluminum oxide ($LaAlO_3$) | 25 |
| barium strontium titanate ($Ba_{1-x}Sr_xTiO_3$) | ~20—200 |
| barium strontium oxide ($Ba_{1-x}Sr_xO_3$) | ~20—200 |
| $PbTiO_3$ | ~20—200 |
| barium titanate ($BaTiO_3$) | ~20—200 |
| strontium titanate $SrTiO_3$ | ~20—200 |
| $PbZrO_3$ | ~20—200 |
| PST ($PbSc_xTa_{1-x}O_3$) | 3000 |
| PZN ($PbZn_xNb_{1-x}O_3$) | ~500—5000 |
| PZT ($PbZr_xTi_{1-x}O_3$) | ~150—1000 |
| PMN ($PbMg_xNb_{1-x}O_3$) | ~500—5000 |

It is noted that the K-values for both standard-K and high-K materials may vary to some degree depending on the exact nature of the dielectric material. Thus, for example, differences in purity, crystallinity and stoichiometry, may give rise to variations in the exact K-value determined for any particular dielectric material.

As used herein, when a material is referred to by a specific chemical name or formula, the material may include non-stoichiometric variations of the stoichiometrically exact formula identified by the chemical name. For example, tantalum oxide, when stoichiometrically exact, has the chemical formula $Ta_2O_5$, but may include variants of stoichiometric $Ta_2O_5$, which may be referred to as $Ta_xO_y$, in which either of x or y vary by a small amount. For example, in one embodiment, x may vary from about 1.5 to about 2.5, and y may vary from about 4.5 to about 5.5. In another embodiment, x may vary from about 1.75 to about 2.25, and y may vary from about 4 to about 6. Such variations from the exact stoichiometric formula fall within the definition of tantalum oxide. Similar variations from exact stoichiometry for all chemical names or formulas used herein are intended to fall within the scope of the present invention. For example, again using tantalum oxide, when the formula $Ta_2O_5$ is used, $Ta_xO_y$ is included within the meaning. Thus, in the present disclosure, exact stoichiometry is intended only when such is explicitly so stated. As will be understood by those of skill in the art, such variations may occur naturally, or may be sought and controlled by selection and control of the conditions under which materials are formed.

With continued reference to FIG. 3B, the method 50 continues in step 66 where a layer of spacer material 68 is deposited using a technique appropriate for the desired material. As indicated above, the material selected for the spacers 42 can be, for example, a nitride (e.g., silicon nitride), an oxide (e.g., silicon oxide), an undoped polycrystalline semiconductor (e.g., polysilicon), or the like. The layer of spacer material 68 is deposited to a height that is at least as high as an upper surface of the gate 34. Following deposition, the layer of spacer material 68 and the liner 44 can be polished (using, for example, chemical-mechanical planarization (CMP)) so that the layer of spacer material 68 has an upper surface that is generally even with the upper surface of the gate 34. Alternatively, the layer of spacer material 68 is polished to have an upper surface that is generally even with an upper surface of a portion of the liner 44 disposed on top of the gate 34 and the portion of the liner 44 disposed on top of the gate 34 is left, at least temporarily, in place.

Figure 3C:
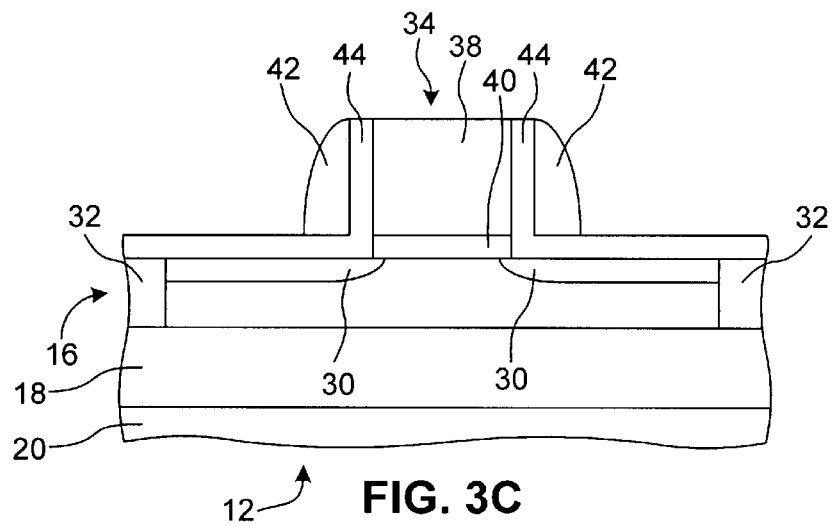

With additional reference to FIG. 3C, the sidewall spacers 42 are formed from the layer of spacer material 68 in step 70. The layer of spacer material 68 can be anisotropically etched (using, for example, dry etching, or RIE) back to the underlying material, which is the liner 44. The liner 44 acts as an etch stop to detect the etch end point for the etching of the layer of spacer material. For example, a change in spectroscopic emissions from the wafer 12 can indicate when the layer of spacer material 68 has been etched down to the liner 44. Alternatively, a timed etch can be used. The spacers 42 can extend laterally from the gate 34 for a desired distance (e.g., about 300 Å to about 1,000 Å).

Referring back now to FIG. 1, the sidewall spacers 42 and the gate 34 act as a self-aligned mask for the implantation of the deep doped regions 28 in step 72. Implanting dopant species to form the deep doped regions 28 of the source 22 and the drain 24, respectively, is well known in the art and will not be described in great detail herein. Briefly, to form a P-type deep doped region 28, ions such as boron, gallium or indium can be implanted. N-type deep doped regions 28 can be formed by implanting ions such as antimony, phosphorous or arsenic. The energy and dosage of the ion species can be determined empirically for the device being fabricated. Following implantation of the deep doped source and drain regions 28, an anneal cycle can be carried out to activate the dopant species and/or to recrystallize the layer of semiconductor material 16. It is noted that the ions used to form the deep doped regions 28 can be implanted through the liner 44 and/or through another layer such that the liner 44 and/or another layer acts as an implant screen. Also, the implanted ions may laterally diffuse slightly under the spacers 42 as is conventional. Following implantation of the deep doped regions 28, the spacers 42 can optionally be removed using, for example, a wet chemistry etching process. Should the spacers 42 be removed, the liner 44 can again function as an etch stop and/or to minimize damage to underlying layers of the semiconductor device 10.

Next, in step 74, portions of the liner 44 can be removed to open the source 22 and the drain 24. It is noted that etching processes used for removing high-K materials generally do not react with standard-K materials used for the isolation regions 32 and/or dielectric layers (e.g., the gate dielectric 40 ). Therefore, the etching process selected for the high-K material of the liner 44 has etch selectivity that will generally not react with the material used to form the isolation regions 32 and/or the gate dielectric 40 if the gate dielectric 40 is formed from a standard K material. Therefore, upon removing the liner 44, there will be no or very little removal of portions of the isolation regions 32 and/or the gate dielectric 40. Accordingly, high quality isolation regions 32 can be maintained throughout the semiconductor device 10 fabrication process and there can be substantially no undercut of the gate dielectric 40 under the gate electrode 38. As a result, isolation between semiconductor devices formed on the wafer may not be degraded and/or the channel 36 can be well defined. However, operation of the semiconductor device 10 will generally not be degraded by the undesired removal of portions of the isolation regions 32 and/or the gate dielectric 40. As one skilled in the art will appreciate, if removal of a conventional liner (e.g., made from silicon nitride or silicon oxide) was desired, the etching process would often also attack, or react with, other components of the transistor, such as the isolation regions 32 and/or the gate dielectric 40.

Thereafter, in step 76, any additional processing to complete the formation of the semiconductor device 10 and to interconnect devices formed on the wafer 12 can be carried out. Such additional processing can include forming the source contact 46 and the drain contact 48. In the illustrated embodiment, the source contact 46 and the drain contact 48 are formed from a silicide. Briefly, the silicide can be formed by depositing a layer of metal (such as cobalt, nickel, molybdenum or titanium) and reacting the metal with the layer of semiconductor material 16. Step 76 can also include processing to form, for example, a cap layer (or passivation layer), contact holes or vias, conductor runs and so forth.

Although particular embodiments of the invention have been described in detail, it is understood that the invention is not limited correspondingly in scope, but includes all changes, modifications and equivalents coming within the spirit and terms of the claims appended hereto.

What is claimed is:

1. A semiconductor device comprising:
    a layer of semiconductor material having an active region defined by at least one shallow trench isolation region, wherein the at least one shallow trench isolation region is composed of silicon dioxide;
    a gate disposed on the layer of semiconductor material, the gate including a gate dielectric and a gate electrode, the gate electrode spaced from the layer of semiconductor material by the gate dielectric and the gate defining sidewalls;
    a sidewall spacer disposed adjacent each sidewall of the gate and each sidewall spacer extending laterally from the gate over the layer of semiconductor material; and
    a liner composed of a high-K material, the liner having portions separating the sidewall spacers and the gate and the liner having portions separating the sidewall spacers and the layer of semiconductor material, the liner functioning as an etch stop during formation of the sidewall spacers and the liner being removable by an etch process that has substantially no reaction with the at least one shallow trench isolation region.

2. The semiconductor device according to claim 1, wherein the sidewall spacers and the gate act as a self aligned mask for implantation of dopant species to form deep doped regions of a source and a drain in the layer of semiconductor material.

3. The semiconductor device according to claim 1, wherein the liner is composed of one or more materials selected from hafnium silicate, hafnium oxide, aluminum oxide and mixtures thereof.

4. The semiconductor device according to claim 1, wherein the gate dielectric is made from a high-K material.

5. The semiconductor device according to claim 1, wherein the sidewall spacers are composed of one or more materials selected from silicon nitride, silicon oxide, undoped polysilicon and mixtures thereof.

6. The semiconductor device according to claim 1, wherein the layer of semiconductor material is disposed on an insulating layer, the insulating layer disposed on a semiconductor substrate.

7. The semiconductor device according to claim 1, wherein the liner has a relative permittivity (K) of about 10 or higher.

8. The semiconductor device according to claim 1, wherein lateral ends of the gate dielectric are vertically aligned with lateral ends of the gate electrode.

9. The semiconductor device according to claim 2, wherein the sidewall spacers are sacrificial and are removed following implantation of the dopant species to form the deep doped regions of the source and the drain.

10. A semiconductor device comprising:
- a layer of semiconductor material having an active region defined by at least one shallow trench isolation region, wherein the at least one shallow trench isolation region is composed of silicon dioxide;
- a gate disposed on the layer of semiconductor material, the gate including a gate dielectric and a gate electrode, the gate electrode spaced from the layer of semiconductor material by the gate dielectric and the gate defining sidewalls;
- a sidewall spacer disposed adjacent each sidewall of the gate and each sidewall spacer extending laterally from the gate over the layer of semiconductor material; and
- a liner composed of a high-K material, the liner having portions separating the sidewall spacers and the gate and the liner having portions separating the sidewall spacers and the layer of semiconductor material, the liner functioning as an etch stop during formation of the sidewall spacers, the liner being removable by an etch process that has substantially no reaction with the at least one shallow trench isolation region and the gate dielectric.

11. The semiconductor device according to claim 10, wherein the gate dielectric has substantially no undercut with respect to the gate electrode.

12. The semiconductor device according to claim 10, wherein the sidewall spacers are sacrificial and are removed following implantation of dopant species to form deep doped regions of a source and a drain in the layer of semiconductor material.

* * * * *